United States Patent [19]
Quittkat et al.

[11] Patent Number: 4,620,162
[45] Date of Patent: Oct. 28, 1986

[54] TUNABLE TRIANGLE WAVE GENERATOR WITH TWO-PHASE SINUSOIDAL OUTPUTS

[75] Inventors: Jörg Quittkat, Neuberg; Gerhard Thiel, Freigericht; Ruth Ursula, Ronneburg, all of Fed. Rep. of Germany

[73] Assignee: Nukem GmbH, Hanau, Fed. Rep. of Germany

[21] Appl. No.: 651,319

[22] Filed: Sep. 17, 1984

[30] Foreign Application Priority Data

Sep. 24, 1983 [DE] Fed. Rep. of Germany ....... 3334592

[51] Int. Cl.$^4$ ............................................ H03K 3/023
[52] U.S. Cl. ...................................... 331/45; 331/60; 331/143; 331/150; 331/177 R
[58] Field of Search .................... 331/60, 45, 111, 143, 331/150, 177 R

[56] References Cited

U.S. PATENT DOCUMENTS 3,831,113 8/1974 Ahmed ................................ 331/111
3,978,424 8/1976 Hobo et al. ........................... 331/45

FOREIGN PATENT DOCUMENTS 3229613 10/1983 Fed. Rep. of Germany .
2105937 3/1983 United Kingdom ................ 331/111

OTHER PUBLICATIONS

"Semiconductor Circuit Technics," by U. Tietze, Ch. Schenk, 5th Ed., Springer Publishing House Berlin, Heidelberg, N.Y., 1980, pp. 218, 219, 439–443, 488–490, 646–649.

"Simple Function Generator Uses Two Low-Cost ICs", by David Edwards, Electronics Australia, vol. 36, No. 11, pp. 50-51, 53-54, 107, Feb. 1975.

*Primary Examiner*—Siegfried H. Grimm
*Attorney, Agent, or Firm*—Cushman, Darby & Cushman

[57] ABSTRACT

A continuously tunable function generator comprises a first function generator (10) with a triangle voltage generator including a comparator (24), which controls the commutation of a capacitor (14) from a charging phase to a discharging phase and vice versa in relation to an upper and lower preset amplitude value of the voltage at the capacitor (14). The triangle voltage (50) arising at the capacitor (14) is supplied to a second comparator (32) of another triangle voltage generator. The second comparator (32), commutates a second capacitor (38) of the same capacitance as the first capacitor from the charging phase to the discharging phase and vice versa. A reference voltage corresponding to the mean value of the upper and the lower amplitude value is applied to a second input of the second comparator. The charging currents and the discharging currents are identical, constant, and adjustable for changing the frequency of the triangle voltages. The capacitors (14, 38) are series-connected to sine function networks (30, 48) to produce sine and cosine wave output signals.

13 Claims, 3 Drawing Figures

TUNABLE TRIANGLE WAVE GENERATOR WITH TWO-PHASE SINUSOIDAL OUTPUTS

FIELD OF THE INVENTION

The invention relates to a function generator with a triangle voltage generator, which comprises a comparator controlling the alternating switching of a capacitor between a charging phase and a discharging phase as a function of an upper and lower predetermined amplitude level of the voltage across the capacitor.

BACKGROUND OF THE INVENTION

A function generator which functions well even at high frequencies is disclosed in the book "Semi-Conductor Circuit Technics" by U. Tietze, Ch. Schenk, 5th Ed., Springer Publishing House (Berlin, Heidelberg, N.Y., 1980) at page 443. This function generator is used for generating a triangle voltage and a rectangle voltage.

The same book discloses on pages 218 and 219 the simultaneous generation of a sine-and-cosine function in the argument range $-\pi \leq x \leq \pi$, i.e. over a full period, by means of function networks. To produce such signals, two auxiliary triangle voltages are generated by means of resistor networks and comparators from an input voltage ranging between a positive and a negative limit value. The auxiliary triangle voltages are supplied to sine-function networks.

The same book on pages 488 to 490 teaches the generation of sine-and-cos functions in digital form. The sine-and-cos levels are contained in read-only memories within the scope of a schedule. If high resolution is desired, a great amount of data must be stored to specify the level of the sine and cosine waveforms for different input values. By interpolation between stored values, the storage requirement can be reduced. However, the additional computing time needed to interpolate increases the total time needed to make the function values available.

Finally it is known from the above mentioned book, at pages 646 to 649, to use digital-analog converters for the generation of sine oscillations. A digital input signal corresponding to an increasing and decreasing numerical sequence is applied to an analog multiplexer, the weighting of which is accordingly adjusted.

SUMMARY OF THE INVENTION

It is an object of the present invention to provide a function generator of the type described above that simultaneously generates a continuous sine-and-cos oscillation, can be tuned through a large range up to high frequencies, and does not show any amplitude and phase shift even when the frequency of the oscillation is changed suddenly.

According to the present invention, a triangle voltage is produced across a first capacitor. The triangle voltage is supplied to a second comparator to which a reference voltage is applied. The second comparator switches a second capacitor (of the same capacitance as that of the first capacitor) from the charging phase to the discharging phase and vice versa. The reference voltage corresponds to the mean value of upper and lower amplitude values. The charging currents and the discharging currents of both capacitors are identical and adjustable. A sine function network is series-connected to each of the capacitors.

The circuit arrangement in accordance with the present invention operates accurately over a rather large frequency range, ranging between 100 Hz and some MHz. As there is no amplitude or phase shift when setting a new frequency, only insignificant dead times result. An important feature of the invention is the use of a first tuned-through function generator, which does not have any amplitude-and-phase shift when changing frequencies and produces a sine oscillation, to control a similarly constructed second function generator automatically with a phase displacement of 90°.

In a preferred embodiment, the capacitors during charging each can be connected to a constant current source via a first switching element that can be operated by the comparators, and can be switched to connection with a constant current reducer (sink) by means of another switching element triggered by the comparators during discharging. This arrangement excels in its simple construction.

Preferably, voltage buffers are connected between the capacitors and the sine function networks to reduce the load on the capacitors and increase the accuracy of the arrangement.

In an exemplary embodiment, the constant currents of the constant current sources and constant current reducers can be set all at the same time by means of a control voltage, which can be supplied to the constant current sources and the constant current reducers via a voltage buffer. By means of this arrangement the output frequency can be adjusted in a quick and simple manner.

Another exemplary embodiment includes voltage buffers connected between the capacitors and the sine function networks. In this alternate embodiment, the expense for the generation of the frequency voltages is relatively small.

The function generator of the present invention can be used for the amplitude-and-phase compensation of signals generated by the testing coil of an eddy current testing apparatus.

BRIEF DESCRIPTION OF THE DRAWINGS

The present invention can be better understood by studying the following detailed description of preferred embodiments in conjunction with the appended drawings, from which further details, characteristics and advantages of the invention will become more clear, of which.

DETAILED DESCRIPTION OF THE PREFERRED EMBODIMENT

Figure 1:
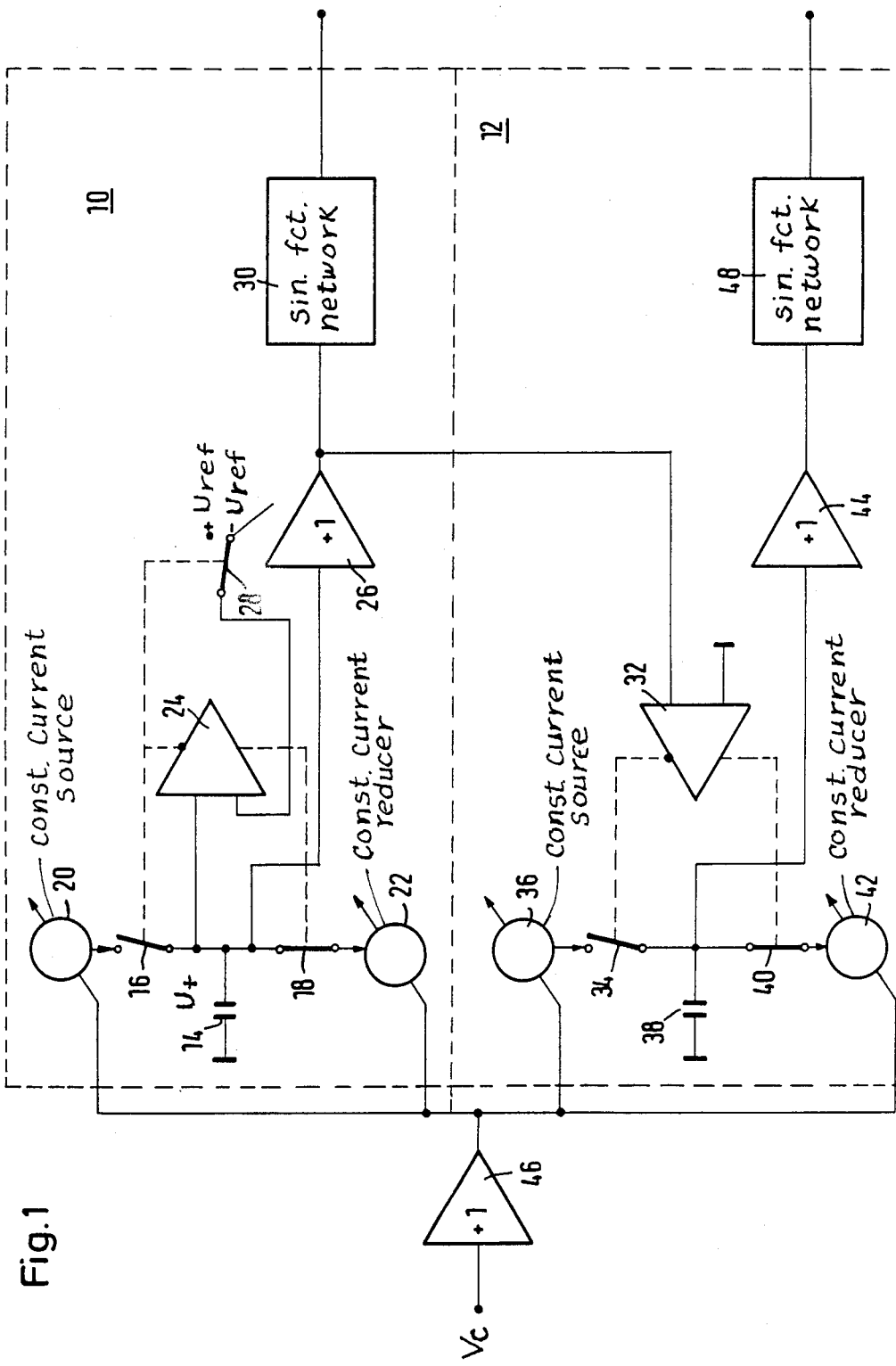
FIG. 1 is a schematic diagram of a presently preferred exemplary embodiment of a through-tuned function generator for the generation of a continuous sine-and-cos oscillation in accordance with the present invention.

A continuously tunable function generator for the generation of a continuous sine-and-cos oscillation includes a first function generator 10 and a second function generator 12 for triangle and sine voltages.

The first function generator 10 includes a capacitor 14 one terminal of which is connected to earth potential, and a second terminal of which is connected to a constant current source 20 via a switching element 16. The second terminal of capacitor 14 is also connected to a constant current reducer (sink) 22 via a switching element 18. The second terminal of the capacitor 14 is further connected to an input of a comparator 24 and to the input of a voltage buffer 26. The inverted output of the comparator 24 controls the switching element 16 and a commutator switch 28. The non-inverted output of comparator 24 controls the switching element 18.

Commutator 28 connects its output alternately to a positive reference voltage $+U_{ref}$ and a negative reference voltage $-U_{ref}$ in response to the inverted output of comparator 24. In the preferred embodiment, reference voltages $+U_{ref}$ and $-U_{ref}$ are equal in magnitude and opposite in sign. The output of the commutator 28 is connected to the second input of the comparator 24.

A sine function network 30 is series-connected to the output of the voltage buffer 26. The output of the voltage buffer 26 is also connected to the input of a second comparator 32, which is an integrated part of the second function generator 12. The comparator 32 is of the same construction as the comparator 24. The second input of the comparator 32 is connected to earth potential.

The inverting output of the comparator 32 controls a switching element 34 connected between a constant current source 36 and a first terminal of a capacitor 38, the second terminal of which is connected to earth potential. The first terminal of capacitor 38 is also connected to a constant current reducer (sink) 42 through a switching element 40. The non-inverting output of comparator 32 controls switching element 40. The first terminal of capacitor 38 is also connected to the input of a voltage buffer 44. A sine function network 48 is connected to the output of buffer 44 (such that capacitor 38, voltage buffer 44 and sine function generator 48 are connected in series).

The construction of the constant current source 36 corresponds to that of the constant current source 20. Likewise, the constant current reducers 22 and 42 are of the same construction. The capacitors 14 and 38 have equal capacitances. The voltage buffers 26, 44 are likewise constructed in the same manner. Also, the sine function networks 30, 48 are of similar construction.

The constant current sources 20, 36 and the constant current reducers 22, 42 generate constant currents of equal levels and are designed so that the current levels they generate can be adjusted. Except for the reference voltages at the second inputs of the comparators 24, 32, the function generators 10 and 12 are thus identical in construction.

The constant currents generated by the constant current sources 20, 36 and the constant current reducers 22, 42 are adjusted by means of a voltage buffer 46 the output of which is connected to the constant current sources 20, 36 and the constant current reducers 22, 42. A control voltage $V_c$ is applied to the input of the voltage buffer 46. The level of control voltage $V_c$ determines the level of the constant currents produced by sources 20, 36 and reducers 22, 42.

The capacitor 14 is alternately charged by the constant current source 20 and discharged by the constant current reducer 22. Due to the alternate charging and discharging of capacitor 14 with constant currents, the voltage across the capacitor changes linearly. The comparator 24 breaks contact between capacitor 14 and constant current source 20 as soon as the voltage across the capacitor 14 reaches a level $+U_{Ref}$ corresponding to the positive reference voltage, by opening switching element 16 and closing switching element 18. Subsequently, the capacitor 14 is discharged by reducer 22, which causes a linear decrease of the capacitor voltage due to constant discharge current. When the capacitor voltage reaches a level equalling the lower reference voltage $=U_{Ref}$, the comparator 24 opens the switching element 18 and closes the switching element 16, and the above described operation is repeated.

Figure 3:
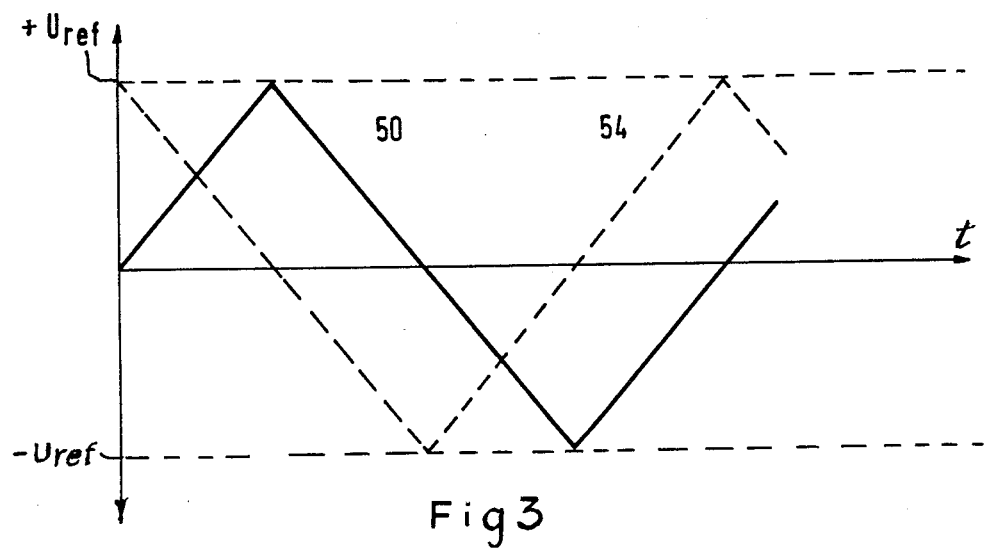
FIGS. 2 and 3 are timing diagrams of signals appearing at different places in the circuit shown in FIG. 1.

A triangle voltage appears across capacitor 14, shown in FIG. 3 as waveform 50. In the diagram of FIG. 3 the voltage is indicated in the direction of the ordinate axis and the time t in the direction of the abscissa.

In FIG. 3, the upper reference voltage is indicated by $+U_{Ref}$ and the lower reference voltage by $-U_{Ref}$. The level of triangle voltage 50 ranges between the limits of $+U_{Ref}$ and $-U_{Ref}$. The voltage increase at the capacitor 14 during charging is as follows:

$$U = U_{Ref} + U_{Ref} = 2U_{Ref}.$$

The capacitance of the capacitor 14 is C. With the constant current I, the following relation exists:

$$C \cdot U = I \cdot T$$

where T is the charging time of the capacitor 14. The charging time corresponds to a half period of the triangle voltage 50. Since C and U are constant, the following relation between I and T exists:

$$I \sim 1/T \text{ or } I \sim f,$$

where f is the frequency of the triangle voltage.

The constant current is thus proportional to the frequency of the triangle voltage. Therefore, by setting an appropriate constant current level, the frequency of the triangle voltage can be changed.

Figure 2:
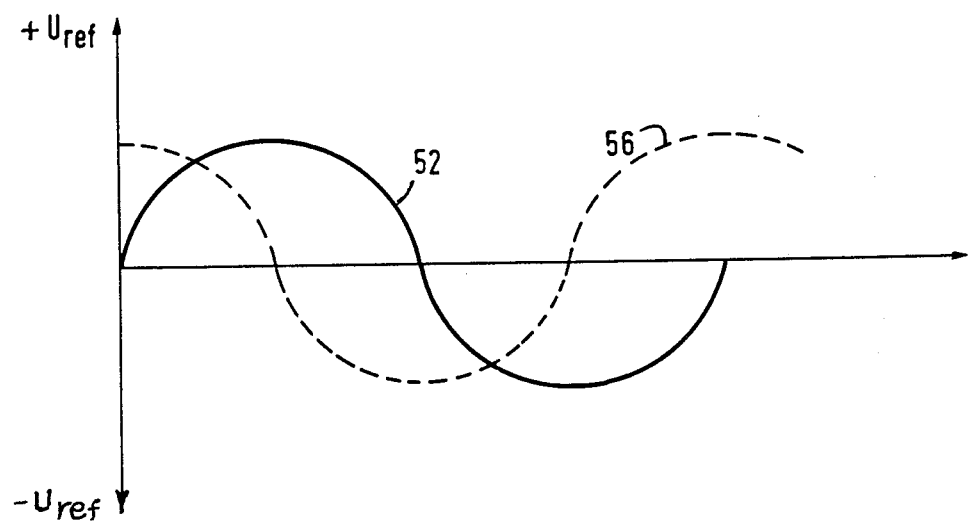

The sine function network 30 generates a sine oscillation from the triangle voltage, indicated at 52 in FIG. 2.

When the triangle voltage 50 reaches the zero level, the comparator 32 is triggered and closes the switching element 34, and at the same time opens the switching element 40 (or respectively, opens the switching element 34 and closes the switching element 40). This causes a triangle voltage 54 to be produced across the capacitor 38, having the same amplitude and the same frequency as the triangle voltage 50, but phase-shifted 90° relative to the triangle voltage 50. The same amplitudes are generated during the charging and discharging of the capacitor 38 and during the charging and discharging of capacitor 14 because the constant current levels charging and discharging the capacitors are the same. Triangle waves 50 and 54 have the same frequency because the time intervals between the activations of the switching elements 16, 18 and the switching elements 34, 40 have equal lengths.

The sine function network 48 converts the triangle voltage 54 (shown in FIG. 3 in broken lines) into a sine oscillation 56 (likewise shown in broken lines in FIG. 2). Due to the phase lead of 90° of the triangle voltage 54 as compared to the triangle voltage 50, the oscillation 56 represents a cosine oscillation and the oscillation 52 represents the corresponding sine oscillation.

The circuit arrangement as shown in FIG. 1 operates over a rather large frequency range, (for example, is between 100 Hz and 5 MHz), perfectly and accurately. When changing the oscillation frequency by a corresponding change of the current I, no amplitude or phase shifts will occur. Sine and cos oscillations are available simultaneously. Therefore, this circuit arrangement is especially suitable for the amplitude-and-phase compensation of signals which are received during the course of eddy current testing of workpieces.

We claim:

1. A function generator including:
   a first triangle voltage generator comprising a first capacitor, and a first comparator means for switching said first capacitor between a charging phase and a discharging phase and vice versa, in relation to an upper and a lower preset amplitude value of the voltage across the first capacitor;
   a further triangle voltage generator including a second capacitor having a capacitance equal to that of said first capacitor, and second comparator means, connected to receive the voltage across said first comparator and also connected to receive a reference voltage, for switching said second capacitor between a charging phase and a discharging phase, said reference voltage being equal to the mean value of the upper and the lower preset amplitude values;
   means for setting the charging currents and the discharging currents of said first and second capacitors to be identical and for adjusting said charging and discharging currents;
   a first sine function network series-connected to the first capacitor; and
   a second sine function generator connected in series to said second capacitor.

2. A function generator according to claim 1, further including:
   first and second constant current sources;
   first and second constant current reducers;
   first switching means, operatively connected to said first comparator, for alternately connecting the first capacitor during the charging phase to said first constant current source and connecting said first capacitor during the discharging phase to said first constant current reducer in response to an output of said first comparator; and
   second switching means operatively connected to said second comparator, for alternately connecting said second capacitor to said second current source during the charging phase and connecting said second capacitor to said second current reducer during the discharging phase in response to an output of said second comparator.

3. A function generator according to claim 2, wherein the first and second switching means simultaneously connect said first and second capacitors to said first and second current sources, respectively, and simultaneously connect said first and second capacitors to said first and second current reducers, respectively.

4. A function generator according to claim 1, further including:
   means for alternately connecting a further input of said first comparator to a positive and to an identical negative reference voltage ($+U_{Ref}, -U_{Ref}$); and
   means for connecting a further input of the second comparator to earth potential.

5. A function generator according to claim 1, further including:
   a first voltage buffer connected between said first capacitor and said first sine function network; and
   a second voltage buffer connected between said second capacitor and said second sine function network.

6. A function generator according to claim 2, further including control means for applying a control voltage to said first and second constant current sources and to said first and second constant current reducers, said control voltage simultaneously adjusting the level of currents produced by said first and second current sources and the level of currents sunk by said first and second current reducers.

7. A function generator according to claim 1, further including commutator means, connected to receive first and second reference voltages, for alternately connecting a further input of said first comparator, in response to the output of said first comparator, to said first and second reference voltages.

8. Apparatus for generating signals comprising:
   a first capacitor;
   first comparing and switching means for charging said first capacitor when the voltage across said first capacitor falls to a preset lower level and for discharging said first capacitor when the voltage across said first capacitor rises to a preset upper level greater than said lower level;
   a second capacitor having a capacitance equal to the capacitance of said first capacitor; and
   second comparing and switching means for comparing the voltage across said first capacitor with a preset reference level and for alternately charging and discharging said second capacitor in response to the result of said comparison.

9. Apparatus as in claim 8 wherein said reference level is equal to the mean value of said preset upper and lower levels.

10. Apparatus as in claim 8 wherein:
    said first comparing and switching means charges said first capacitor at a first predetermined constant rate and discharges said first capacitor at a second predetermined constant rate; and
    said second comparing and switching means charges said second capacitor at said first predetermined constant rate and discharges said second capacitor at said second predetermined constant rate.

11. Apparatus as in claim 10 further including means for adjusting said first and second predetermined constant rates.

12. Apparatus as in claim 8 further including:
    first sine function network means, connected to receive the voltage across said first capacitor, for converting said first capacitor voltage to a sinusoidal waveform; and
    second sine function network means, connected to receive the voltage across said second capacitor, for converting said second capacitor voltage to a sinusoidal waveform.

13. Apparatus as in claim 8 further including reference voltage producing means, responsive to an output of said first comparing and switching means, for connecting a reference voltage at said preset lower level to an input of said first comparing and switching means when the output of said first comparing and switching means is at a first state, and for connecting a reference voltage at said preset upper level to said input of said first comparing and switching means when the output of said first comparing and switching means is at a second state different from said first state.

* * * * *